US008080122B2

(12) United States Patent
Sunohara et al.

(10) Patent No.: US 8,080,122 B2
(45) Date of Patent: Dec. 20, 2011

(54) METHOD OF MANUFACTURING WIRING SUBSTRATE AND METHOD OF MANUFACTURING SEMICONDUCTOR DEVICE

(75) Inventors: Masahiro Sunohara, Kagano (JP); Kei Murayama, Nagano (JP); Mitsutoshi Higashi, Nagano (JP); Hideaki Sakaguchi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 325 days.

(21) Appl. No.: 12/409,862

(22) Filed: Mar. 24, 2009

(65) Prior Publication Data
US 2009/0236031 A1  Sep. 24, 2009

(30) Foreign Application Priority Data

Mar. 24, 2008 (JP) ................................. 2008-076776

(51) Int. Cl.
*B32B 37/00* (2006.01)
(52) U.S. Cl. .......................... 156/247; 156/293; 156/305
(58) Field of Classification Search .................. 156/247, 156/182

See application file for complete search history.

(56) References Cited

U.S. PATENT DOCUMENTS

| 5,960,536 | A * | 10/1999 | Ogino et al. | 29/841 |
| 6,220,499 | B1 * | 4/2001 | Brofman et al. | 228/180.22 |
| 7,145,247 | B2 * | 12/2006 | Kawano et al. | 257/777 |
| 2003/0227095 | A1 * | 12/2003 | Fujisawa et al. | 257/782 |
| 2008/0280399 | A1 * | 11/2008 | Burrell et al. | 438/125 |
| 2009/0236031 | A1 * | 9/2009 | Sunohara et al. | 156/182 |

FOREIGN PATENT DOCUMENTS

| JP | 2002-170840 | 6/2002 |
| JP | 2002170840 A * | 6/2002 |

* cited by examiner

*Primary Examiner* — Philip Tucker
*Assistant Examiner* — Vicki Wu
(74) *Attorney, Agent, or Firm* — Rankin, Hill & Clark LLP

(57) ABSTRACT

There are provided a step of preparing a dummy chip, a step of forming a cavity in a stiffener substrate, a step of providing a second tape base member on one surface of the stiffener substrate, a step of inserting the dummy chip into the cavity to provide the dummy chip on the second tape base member, a step of sealing the stiffener substrate and the dummy chip with a sealing resin, a step of removing the second tape base member and forming a build-up wiring layer on a surface from which the second tape base member is removed, a step of removing the sealing resin; and a step of peeling the dummy chip from the build-up wiring layer.

9 Claims, 12 Drawing Sheets

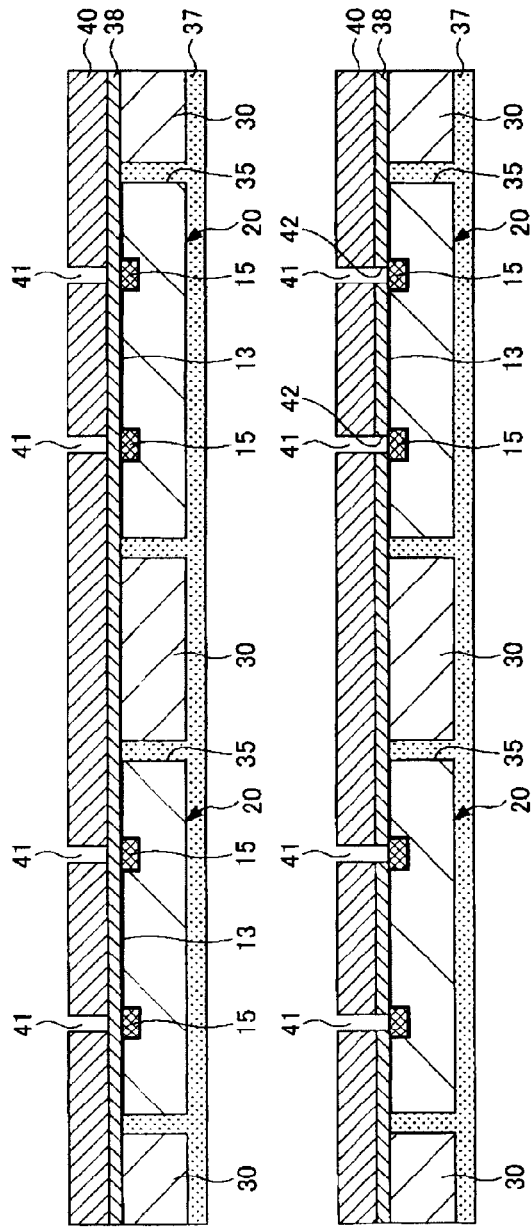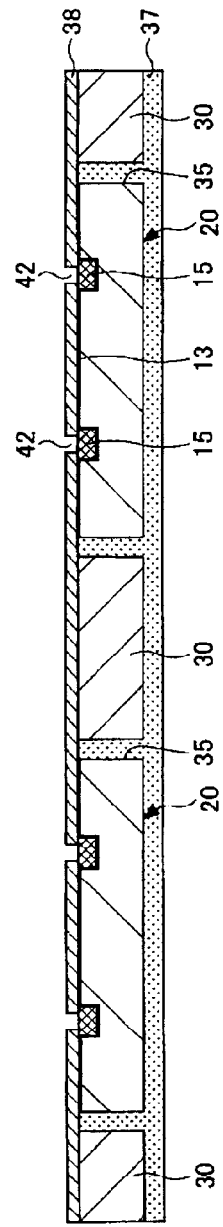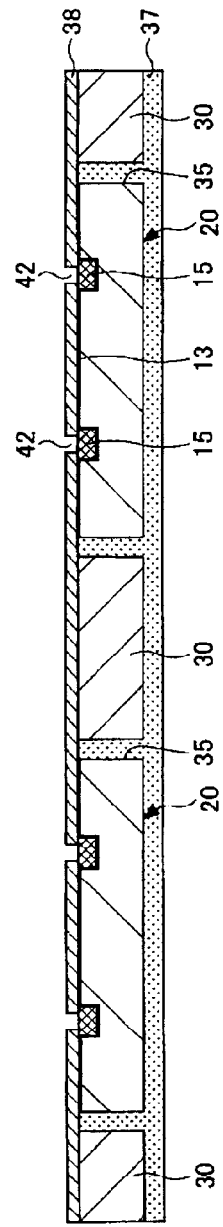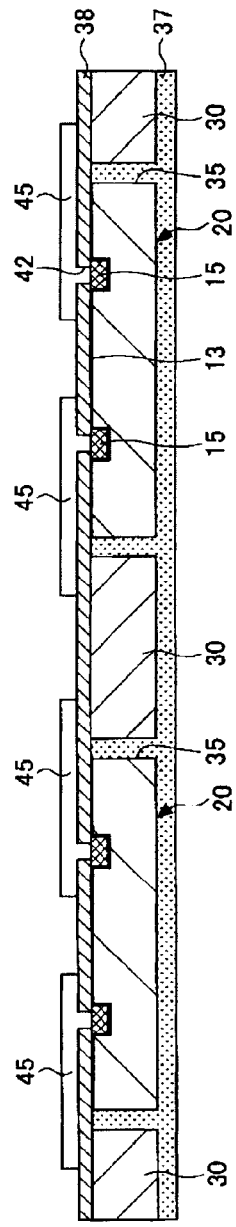

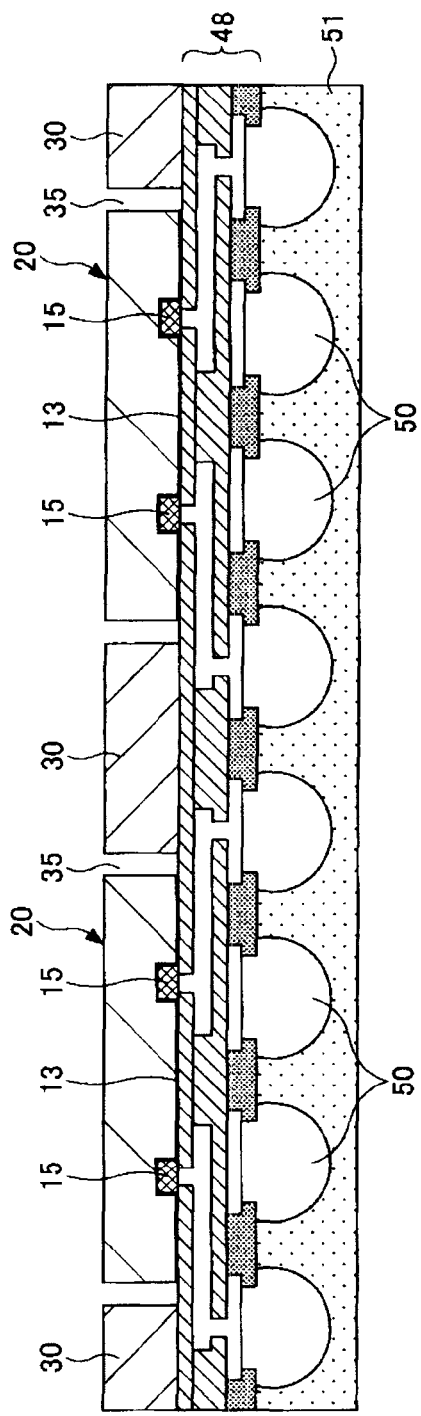
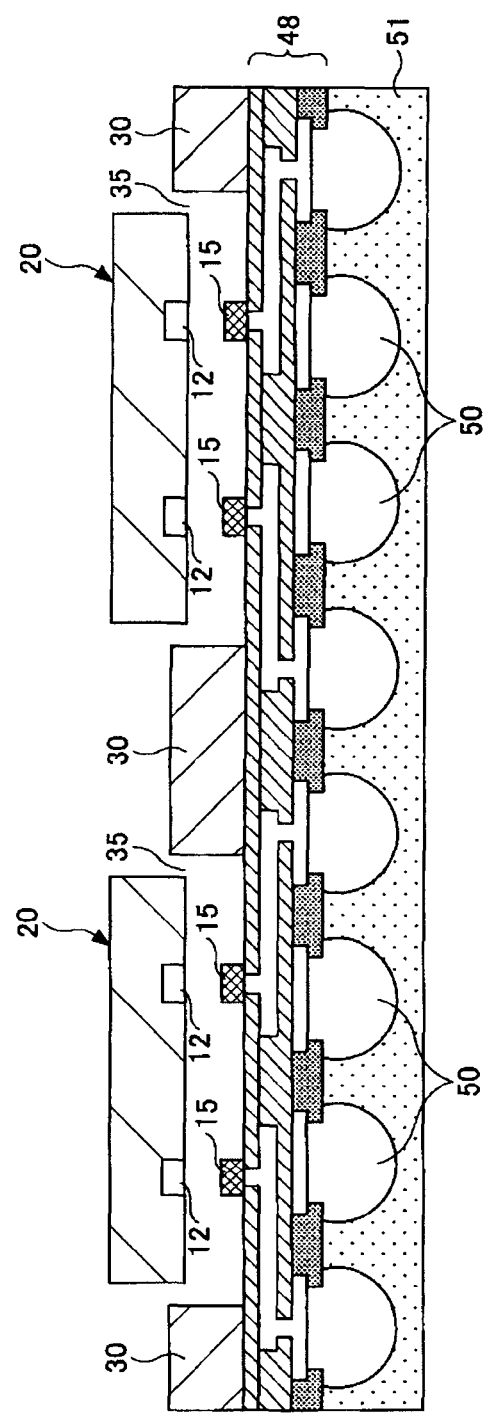

METHOD OF MANUFACTURING WIRING SUBSTRATE AND METHOD OF MANUFACTURING SEMICONDUCTOR DEVICE

TECHNICAL FIELD

The present disclosure relates to a method of manufacturing a wiring substrate and a method of manufacturing an semiconductor device and, more particularly, a method of manufacturing a wiring substrate having a structure in which a chip is built and a method of manufacturing an semiconductor device using the wiring substrate.

RELATED ART

In recent years, along with the needs such as higher performance, size reduction, and the like of the electronic apparatus, the high-density packaging of the electronic component incorporated into the electronic apparatus is proceeding swiftly. Such a method has been employed that a substrate and a semiconductor chip are manufactured by the separate step respectively and then the semiconductor chip is flip-chip mounted onto the substrate that is manufactured individually.

However, it is difficult to achieve sufficiently a higher performance and a size reduction by this method. Therefore, a substrate constructed by installing a chip component into a substrate core portion in substrate manufacturing processes and then stacking a build-up wiring layer on the substrate core portion, i.e., so-called chip built-in substrate, has been proposed.

According to this chip built-in substrate, a size reduction can be achieved. However, electrical connections between pads of the build-up wiring layer and the chip component are provided via the bumps. Therefore, a thickness of the substrate is increased by a height of the bumps. Also, in this structure that the chip component and the pads of the build-up wiring layer are connected electrically via the bumps, such a problem arises that an inductance at the connection portion is increased, in particular, an operation at a high clock frequency becomes unstable.

For this reason, as the method of connecting directly the pads provided to the chip component and the electrodes provided to the substrate, the technology disclosed in Patent Literature 1, the packaging technology called BBUL (Bumpless Build-Up Layer), etc. have been proposed.

FIGS. 1A to 1C and FIGS. 2A to 2D show an example of the method of manufacturing the wiring substrate using BBUL.

In order to manufacture the wiring substrate by using BBUL, as shown in FIG. 1A, a tape base material 3 on a surface of which an adhesive material 4 is provided is prepared. Then, semiconductor chips 1 (chip components) are provided on the tape base material 3.

Pads 2 are formed in advance on the semiconductor chips 1 respectively, then the direction of the pads 2 is adjusted downward, and then the semiconductor chips 1 are pasted on the adhesive material 4. At this time, a pitch between neighboring semiconductor chips 1 is set to a pitch P1 between semiconductor devices 9A (see FIG. 2D) that are finally diced into individual pieces.

Then, the tape base material 3 on which the semiconductor chips 1 are provided is loaded in the molding molds, and then a molding resin 5 is formed in the circumstances that a heat and a pressure are being applied. Accordingly, the semiconductor chips 1 are sealed with the molding resin 5.

After the molding resin 5 is formed, the tape base material 3 is peeled from the semiconductor chips 1 and the molding resin 5, as shown in FIG. 1C. In this state, the pads 2 are exposed from the molding resin 5. Then, as shown in FIG. 2A, first wiring layers 6 are formed on the molding resin 5 by the well-known semi-additive process. At this time, the first wiring layer 6 is connected electrically to the pads 2.

After the first wiring layers 6 are formed, an insulating layer and a wiring layer are stacked alternately on the molding resin 5 by the build-up method, and also vias used to join respective layers are formed. Thus, as shown in FIG. 2B, a build-up wiring layer 7 containing the first wiring layers 6 is formed. Accordingly, a wiring substrate 9 in which the semiconductor chips 1 are built is manufactured.

Then, as shown in FIG. 2C, a ball 8 is arranged in openings, which are formed in the insulating layer formed on the uppermost layer of the build-up wiring layer 7, respectively. Then, the wiring substrate 9 is diced into individual pieces by applying the dicing process. Thus, as shown in FIG. 2D, the semiconductor devices 9A in which the semiconductor chip 1 is built respectively are manufactured.

[Patent Literature 1] JP-A-2002-170840

However, in the method of manufacturing the wiring substrate using BBUL shown in FIGS. 1A to 1C and FIGS. 2A to 2D, the semiconductor chip 1 is embedded in the molding resin 5 and thus it is impossible to exchange the semiconductor chip 1. Therefore, when the defect comes about on the substrate side (the molding resin 5 and the build-up wiring layer 7) in the manufacturing process of the substrate, the semiconductor chip 1 that is a non-defective item should also be discarded. As a result, there existed such problems that this discard brings about a decrease in manufacturing efficiency and an increase in manufacturing cost.

In particular, in the above method of embedding directly the semiconductor chip 1 into the molding resin 5, it is possible that displacement of the embedded position of the semiconductor chip 1 occurs due to the thermal shrinkage caused in forming the molding resin 5. Therefore, it is feared that a pitch P1 between the semiconductor chips 1, which is normal in providing the chips on the tape base material 3 shown in FIG. 1A, is changed to a pitch P2 (P1≠P2) after the molding resin 5 is formed. In this case, there is a danger that the defective connection between the pads 2 of the semiconductor chip 1 and the first wiring layers 6 is caused.

SUMMARY

Exemplary embodiments of the present invention provide a method of manufacturing a wiring substrate and a method of manufacturing a semiconductor device, capable of manufacturing a high-precision wiring substrate at a high efficiency and a low cost.

According to a first aspect of the present invention, a method of manufacturing a wiring substrate includes a first step of preparing a dummy chip; a second step of forming an accommodating opening, in which the dummy chip is accommodated, in a reinforcing substrate; a third step of providing a tape member on one surface of the reinforcing substrate to cover at least the accommodating opening; a fourth step of inserting the dummy chip into the accommodating opening to provide the dummy chip on the tape member; a fifth step of sealing the reinforcing substrate and the dummy chip with a resin; a sixth step of removing the tape member and forming a build-up wiring layer, in which an insulating layer and a wiring layer are stacked, on a surface from which the tape member is removed; a seventh step of removing the resin; and an eighth step of peeling the dummy chip from the build-up wiring layer.

Also, in the above invention, the dummy chip is formed of silicon. Also, the reinforcing substrate is formed of silicon.

Also, in the above invention, the first step includes a process of providing a solder paste on the dummy chip. Also, in the fifth step, the resin is sealed by a molding method.

Also, in the above invention, the first step includes a process of providing a peeling facilitating member, which facilitates a peelability of the dummy chip from the build-up wiring layer in the eighth step, on a surface of the dummy chip on which the build-up wiring layer is formed. Also, the peeling facilitating member is formed of copper.

According to a second aspect of the present invention, the above problems can be solved by providing a method, of manufacturing an semiconductor device, which includes a step of manufacturing the wiring substrate by the above-mentioned method of manufacturing the wiring substrate; and a step of providing a chip component in the wiring substrate.

According to the present invention, the dummy chip that can be detachably attached to the wiring substrate is employed instead of the chip component, and then the wiring substrate is manufactured in a state that this dummy chip is provided. Therefore, even though the defect is caused in the manufactured wiring substrate, there is no necessity to discard the chip component unlike the prior art, and therefore a cost reduction of the wiring substrate can be achieved. Also, the dummy chip can be used again and again, and therefore a cost reduction of the wiring substrate can also be achieved from this respect.

Other features and advantages may be apparent from the following detailed description, the accompanying drawings and the claims.

BRIEF DESCRIPTION OF THE DRAWINGS

FIGS. 7A to 7D are views (#3) explaining the method of manufacturing the wiring substrate as the embodiment of the present invention.

FIGS. 9A to 9B are views (#5) explaining the method of manufacturing the wiring substrate as the embodiment of the present invention.

DETAILED DESCRIPTION

Next, a best mode for carrying out the present invention will be explained with reference to the drawings hereinafter.

FIG. 5A to FIG. 10C are views showing a method of manufacturing a wiring substrate as an embodiment of the present invention along with manufacturing steps. In the method of manufacturing the wiring substrate according to the present embodiment, one feature resides in that the wiring substrate is manufactured in a state that a dummy chip is arranged instead of the chip component, as described later. For this reason, prior to the explanation of the method of manufacturing the wiring substrate using FIG. 5A to FIG. 10C, a method of manufacturing a dummy chip will be explained with reference to FIG. 3A to FIG. 4C hereunder.

Figure 1A:
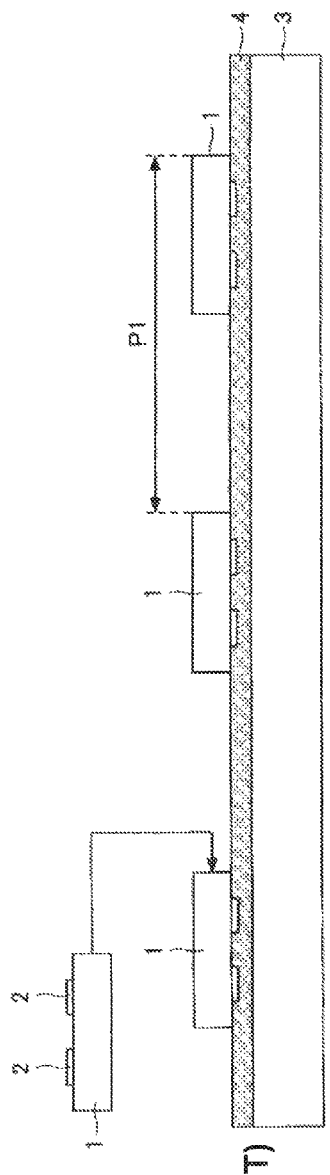
FIGS. 1A to 1C are views (#1) explaining an example of a method of manufacturing a wiring substrate in the prior art.
Figure 1B:
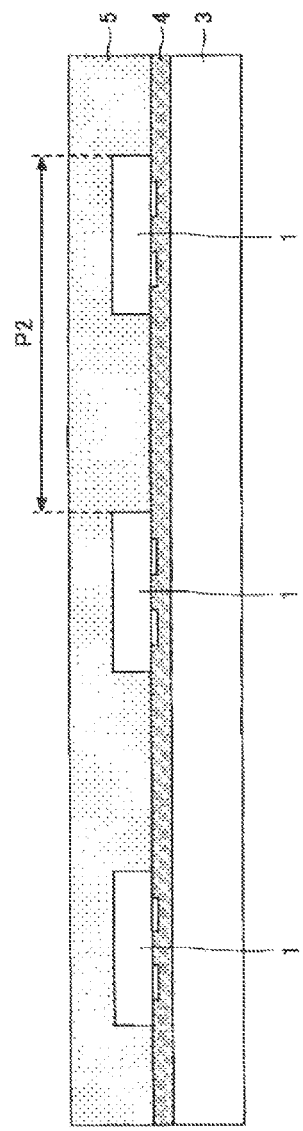
Figure 1C:
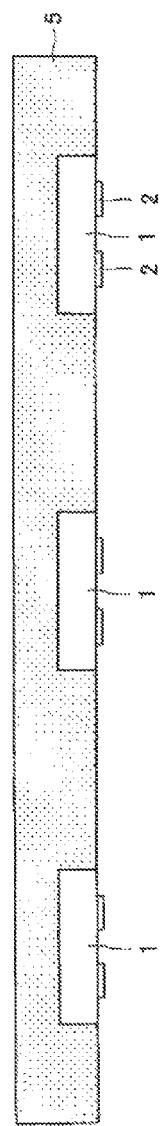
Figures 2A, 2B, 2C, 2D:
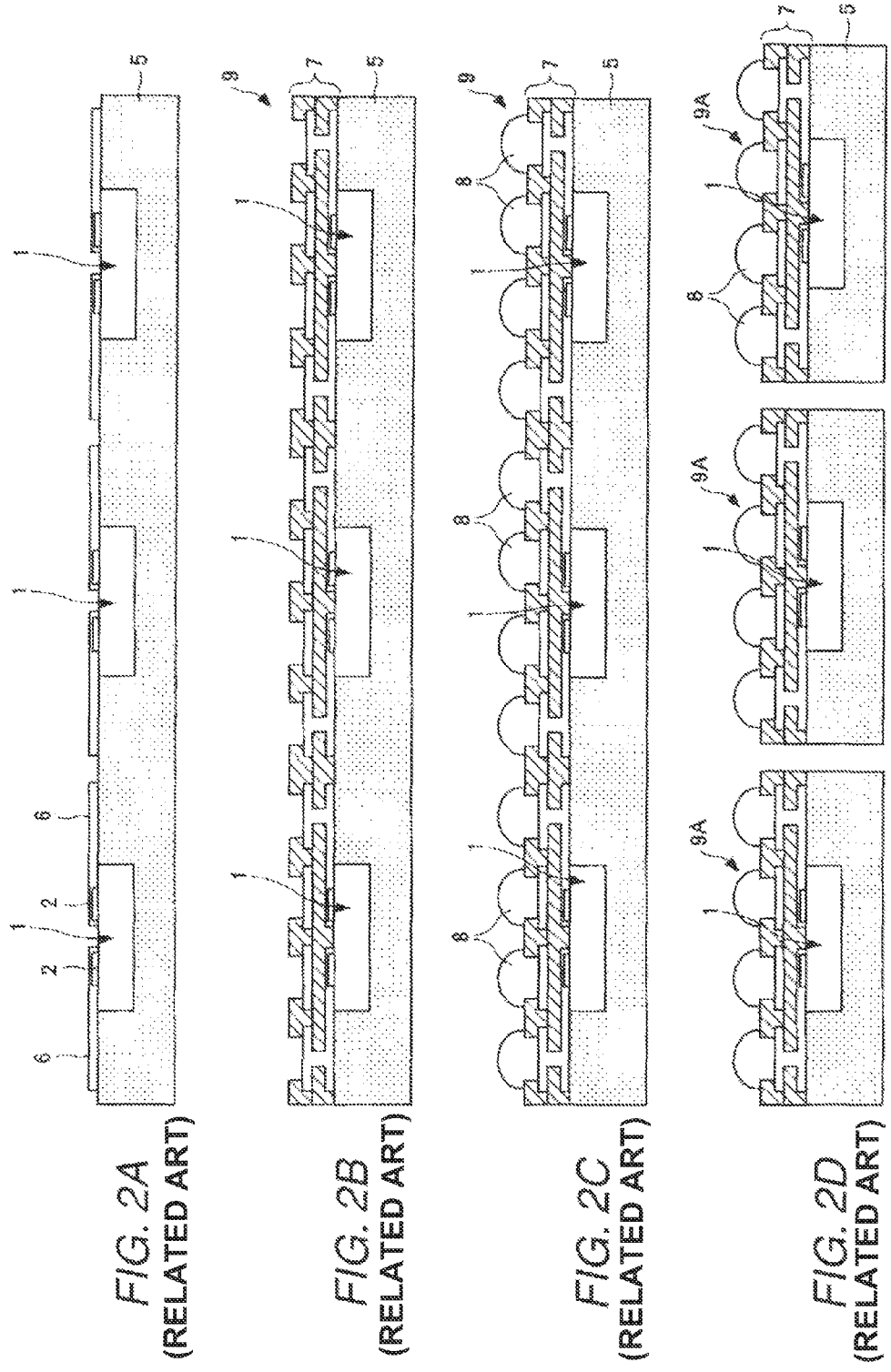
FIGS. 2A to 2D are views (#2) explaining the example of the method of manufacturing the wiring substrate in the prior art.
Figure 3A:
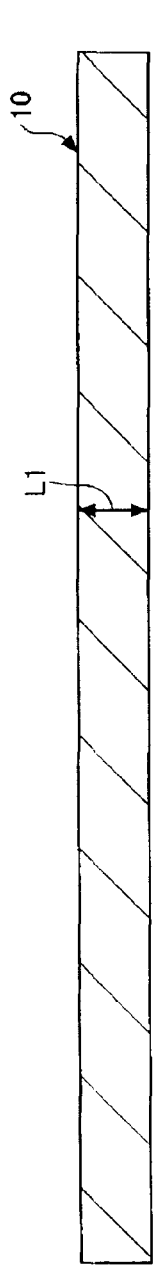
FIGS. 3A to 3D are views (#1) explaining a method of manufacturing a dummy chip used in a method of manufacturing a wiring substrate as an embodiment of the present invention.

In order to manufacture a dummy chip 20, as shown in FIG. 3A, first a dummy chip substrate 10 is prepared. In the present embodiment, a silicon wafer is employed as the dummy chip substrate 10.

In the present embodiment, the semiconductor chip 1 made of silicon is assumed as the chip component that is mounted on a wiring substrate 60 to be manufactured. Therefore, when the silicon is employed as the material of the dummy chip substrate 10 as the base material of the dummy chip 20, the dummy chip 20 exhibits the behavior that is substantially identical to that of the semiconductor chip 1 (e.g., thermal expansion, or the like) during the steps of manufacturing the wiring substrate.

In this case, the material of the dummy chip substrate 10 is not limited to the silicon. Other materials (resin, metal, or their composite material) can be employed if such materials have the substantially equal characteristics (e.g., thermal expansion, and the like) to those of the chip component that is to be mounted. Also, there is no need that the dummy chip substrate 10 should always be formed of the wafer, and the substrate having another shape (e.g., strip shape, or the like) other than the wafer may be employed as the dummy chip substrate 10.

First the polishing process is applied to the dummy chip substrate 10 to have a predetermined thickness L1. This thickness L1 of the dummy chip substrate 10 is set substantially equal to a thickness of the semiconductor chip 1 provided later to the wiring substrate 60 (see FIG. 10B). In the present embodiment, a thickness L1 of the semiconductor chip 1 is set in a range of 200 μm to 725 μm.

Figure 3B:
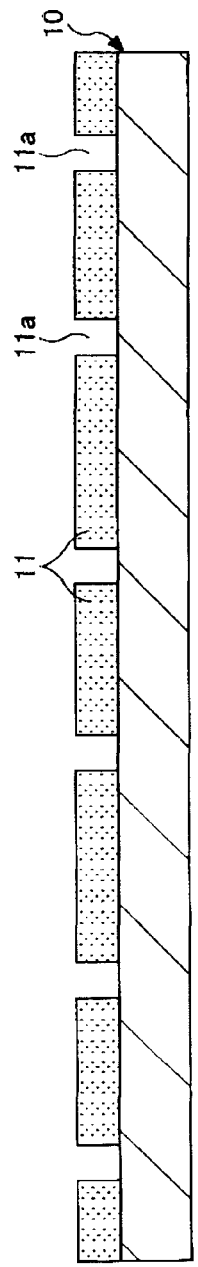
Figure 3C:
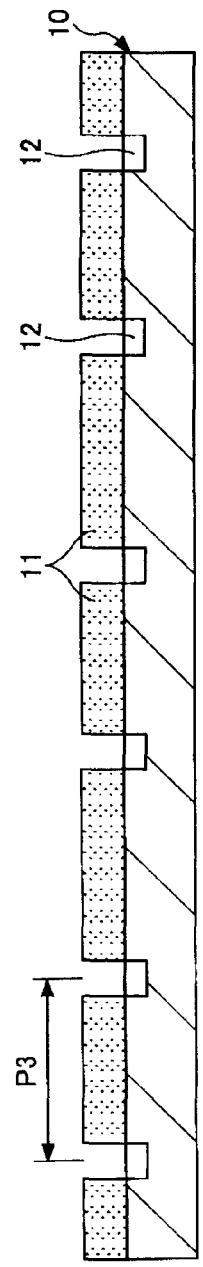

Then, a resist 11 is formed on the dummy chip substrate 10 and also opening portions 11a are formed in the resist 11, as shown in FIG. 3B. Respective forming positions of the opening portions 11a are set to correspond to forming positions of the pads 2 of the semiconductor chip 1. Also, a diameter of the opening portion 11a is set to 20 μm, for example.

In this case, a photoresist can be employed as the resist 11, and either of the positive type and the negative type can be employed. Also, as a light source used in patterning the resist 11, ultraviolet rays can be employed.

Then, the resist 11 is cured by the heating, and then the dry etching process is applied to the dummy chip substrate 10 while using this resist as a mask. As this dry etching process, either the plasma etching or the reactive ion etching (RIE) can be employed.

Thus, concave portions 12 are formed on the dummy chip substrate 10 by applying this dry etching process. A diameter of the concave portion 12 is set to 20 μm, for example, a depth of the concave portion 12 is set to 20 μm, for example, and a pitch P3 between the neighboring concave portions is set to 50 μm, for example.

Figure 3D:
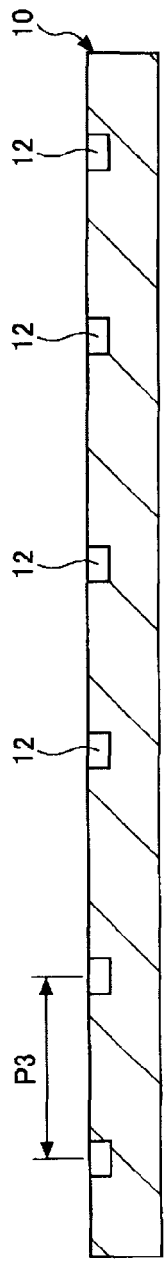

After the concave portions 12 are formed on the dummy chip substrate 10 in this manner, the resist 11 is removed by the ashing, or the like, as shown in FIG. 3D. Accordingly, the concave portions 12 are exposed from a surface of the dummy chip substrate 10.

Figure 4A:
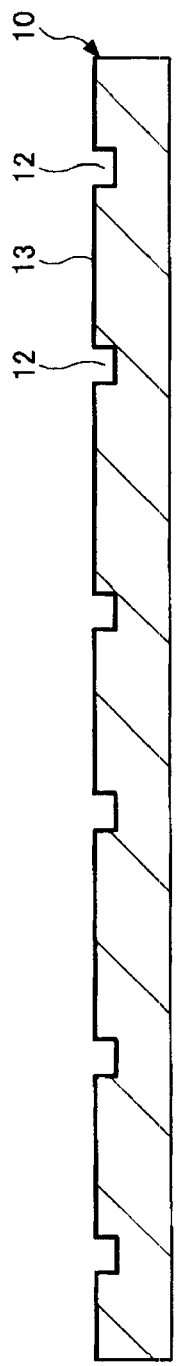
FIGS. 4A to 4C are views (#2) explaining the method of manufacturing the dummy chip used in the method of manufacturing the wiring substrate as the embodiment of the present invention.

Then, a sacrifice layer 13 is formed on the principal surface (a surface on which the concave portions 12 are formed) side of the dummy chip substrate 10. FIG. 4A shows a state that the sacrifice layer 13 is formed on the dummy chip substrate 10. This sacrifice layer 13 is also formed on inner surfaces of the concave portions 12.

The sacrifice layer 13 has such a structure that a titanium (Ti) film and a copper (Cu) film are stacked. As the concrete method of forming the sacrifice layer 13, first Ti is sputtered to have a thickness of 0.1 μm and then Cu is sputtered on the Ti film to have a thickness of 0.5 μm.

Figure 4B:
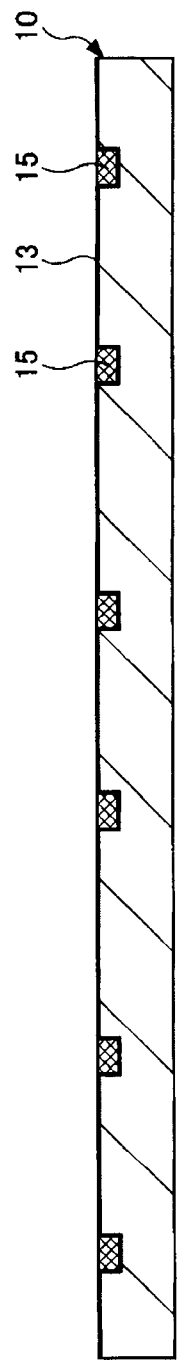

After the sacrifice layer 13 is formed on the dummy chip substrate 10, a solder paste 15 is provided in the concave portions 12 respectively. This solder paste 15 can be provided in the concave portions 12 by the screen printing method, for example. FIG. 4B shows a state that the solder paste 15 is provided in the concave portions 12 respectively.

Figure 4C:
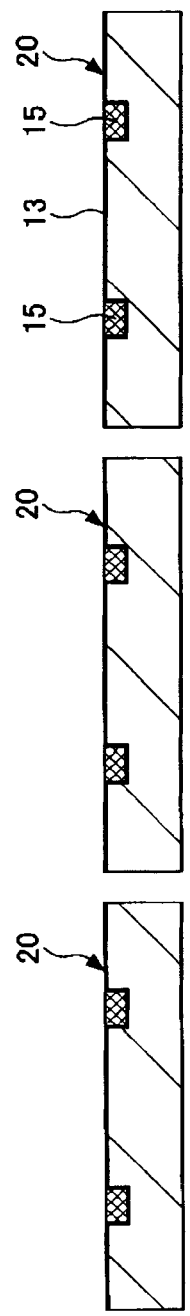

Then, the dicing process is applied to the dummy chip substrate 10 by using the dicing saw. FIG. 4C shows the dummy chips 20 that are diced into individual pieces by the dicing. The dummy chip 20 manufactured in this way has the identical shape to that of the semiconductor chip 1 described later, and a size of the dummy chip 20 is equal to or larger than that of the semiconductor chip 1. For example, one side of the dummy chip 20 is equal to or larger than that of the semiconductor chip 1 by 0 to 15 μm. The dummy chips 20 are manufactured by executing the steps explained as above.

Next, a method of manufacturing the wiring substrate 60 as an embodiment of the present invention will be explained hereunder. The method of manufacturing the wiring substrate 60 according to the present embodiment is executed by using the dummy chips 20 manufactured as above.

In order to manufacture the wiring substrate 60, the dummy chips 20 manufactured by the manufacturing method explained by reference to FIG. 2A to FIG. 3D are prepared (corresponding to a "first step"). When the dummy chips 20 are manufactured from the dummy chip substrate 10 as described above, the sacrifice layer 13 and the solder pastes 15 are already provided on the dummy chips 20 respectively.

However, the dummy chips 20 are used repeatedly as described later, and thus the sacrifice layer 13 and the solder pastes 15 are removed after these chips are used in the preceding manufacturing step. Therefore, in the step of preparing the dummy chips 20 (the "first step"), the process of providing the sacrifice layer 13 and the solder pastes 15 on the dummy chips 20 respectively is executed. Since the method of forming the sacrifice layer 13 and the method of forming the solder pastes 15 are similar to those explained above, their explanation will be omitted herein.

Figure 5A:
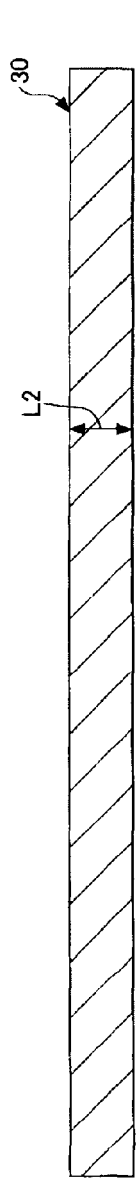
FIGS. 5A to 5E are views (#1) explaining a method of manufacturing a wiring substrate as an embodiment of the present invention.

When the dummy chips 20 are prepared, a stiffener substrate 30 shown in FIG. 5A (corresponding to a reinforcing substrate) is prepared. In the present embodiment, the silicon wafer is used as this stiffener substrate 30.

In this case, the material of the stiffener substrate 30 is not limited to the silicon. Other materials (resin, metal, or their composite material) can be employed if such materials can support (reinforce) a build-up wiring layer 48 constituting the wiring substrate 60 to be manufactured and have a small difference in thermal expansion from the semiconductor chip 1 that is to be mounted. Also, there is no need that the stiffener substrate 30 should always be formed of the wafer, and the substrate having another shape (e.g., strip shape, or the like) other than the water may be employed as the stiffener substrate 30.

Then, the polishing process is applied to the stiffener substrate 30 to get a predetermined thickness L2. This thickness L2 of the stiffener substrate 30 is set to a thickness that can support (reinforce) the build-up wiring layer 48. In the present embodiment, a thickness L2 of the stiffener substrate 30 is set in a range of 200 μm to 725 μm.

Figure 5B:
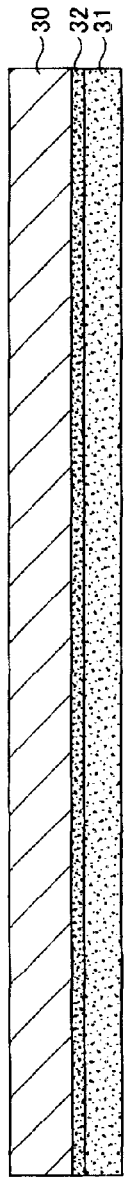

Then, as shown in FIG. 5B, a first tape base material 31 is provided on one surface (lower surface in FIG. 5B) of the stiffener substrate 30 whose polishing process is completed via an adhesive material 32. In the present embodiment, a UV setting resin that is cured by irradiating the ultraviolet rays (UV) is employed as the adhesive material 32.

However, a thermosetting resin that is cured by applying a heat, an X-ray setting resin that is cured by irradiating the X ray, and the like can be employed as the adhesive material 32. Also, as the material of the first tape base material 31, for example, polyethylene terephthalate (PET) can be employed. In this case, a thickness of the first tape base material 31 is about 100 μm and a thickness of the adhesive material 32 is about 20 μm.

Figure 5C:
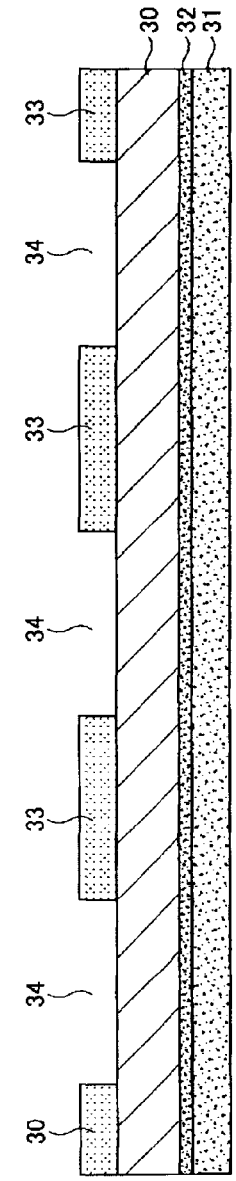

Then, a resist 33 is formed on the stiffener substrate 30, and also opening portions 34 are formed in the resist 33, as shown in FIG. 5C. Forming positions of the opening portions 34 correspond to the providing position of the semiconductor chip 1, and a size of the opening portion 34 is set slightly larger than the profile of the semiconductor chip 1 (this will be described in detail later).

Also, the photoresist can be employed as the resist 33, and either of the positive type and the negative type can be employed. Also, as the light source used in patterning the resist 33, the ultraviolet rays can be employed.

Then, the resist 33 is cured by the heating, and then the dry etching process is applied to the stiffener substrate 30 while using this resist as a mask. As an etching gas used in this dry etching process, for example, carbon tetrafluoride ($CF_4$) can be employed. As this dry etching process, either the plasma etching or the reactive ion etching (RIE) can be employed.

Figure 5D:
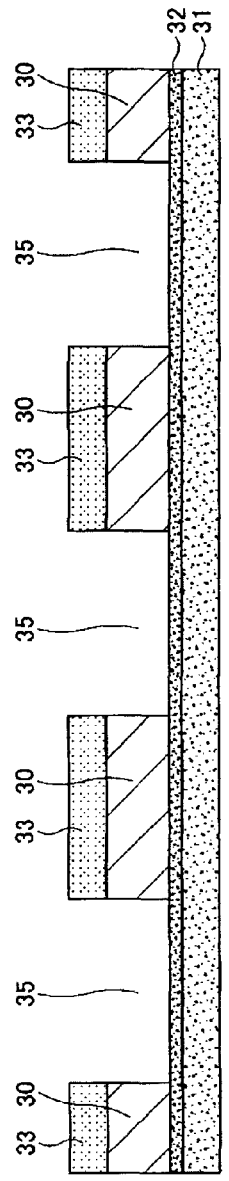

Cavities 35 are formed in the stiffener substrate 30 by applying the dry etching (corresponding to a "second step"). FIG. 5D shows a state that the cavities 35 are formed in the stiffener substrate 30. The cavities 35 are formed to pass through the stiffener substrate 30, and therefore the tape base material 31 is exposed from bottom portions of the cavities 35 respectively.

The cavity 35 formed in the stiffener substrate 30 fulfills a function of accommodating the semiconductor chip 1 or the dummy chip 20 therein. Therefore, a size of the cavity 35 is set to a dimension that enables the cavity 35 to accommodate the semiconductor chip 1 or the dummy chip 20 without fail.

However, the stiffener substrate 30 acts as the reinforcing member, and its mechanical strength is lowered when a shape of the opening portion 34 becomes larger. Therefore, a size of the cavity 35 is set such that a clearance of 5 μm to 10 μm (ΔW indicated with an arrow in FIG. 6A) is formed between an outer wall of the semiconductor chip 1 or the dummy chip 2 and an inner wall of the cavity 35 in a state that the semiconductor chip 1 or the dummy chip 20 is fitted into the cavity 35.

Figure 5E:
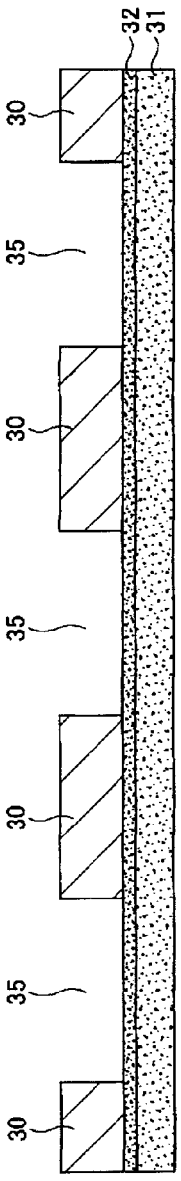

When the cavities 35 are formed in the stiffener substrate 30 in this way, the resist 33 is removed by the ashing, or the like, as shown in FIG. 5E. Then, the adhesive material 32 is cured by irradiating the ultraviolet rays to lower an adhesive force. Then, the first tape base material 31 is peeled from the stiffener substrate 30 at a point of time when an adhesive force is lowered. As a result, the stiffener substrate 30 in which the cavities 35 are formed is manufactured.

Here, in the present embodiment, the step of forming the cavities 35 in the stiffener substrate 30 is applied. But the stiffener substrate 30 in which the cavities 35 are formed in advance can be applied. In this case, the first tape base material 31 is not needed.

Then, a second tape base material 36 on which an adhesive material 36a (formed of a thermosetting resin) is provided is pasted on one surface of the stiffener substrate 30 (in the present embodiment, a lower surface in FIG. 6A)(corresponding to a "third step"). The materials similar to the first tape base material 31 and the adhesive material 32 can be employed as the second tape base material 36 and the adhesive material 36a. That is, the UV setting resin, the X-ray setting resin, and the like can be employed as the material of the adhesive material 36a, in addition to the thermosetting resin. Also, PET can be employed as the material of the second tape base material 36. Alternatively, without providing the second tape base material 36 and the adhesive material 36a, the first base material 31 and the adhesive material 32 may be used for disposing the dummy chip 20 in the next process as shown in FIG. 6A and in this case, the first base material 31 and the adhesive material 32 are not removed in FIG. 5E.

Figure 6A:
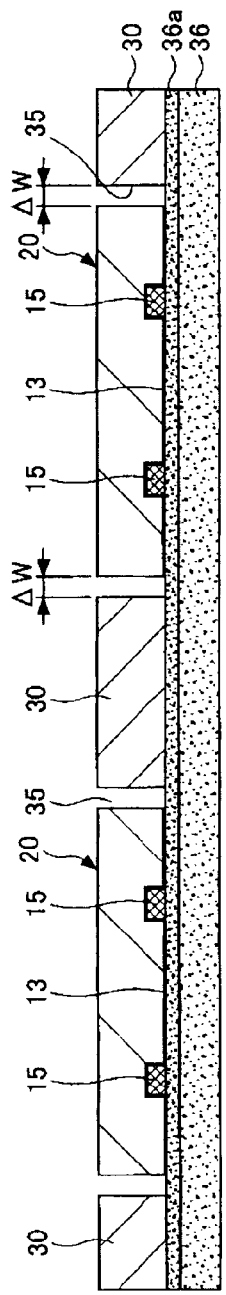
FIGS. 6A to 6D are views (#2) explaining the method of manufacturing the wiring substrate as the embodiment of the present invention.

Then, the dummy chip 20 prepared in advance is inserted into the cavities 35 formed in the stiffener substrate 30 respectively, and then the dummy chips 20 are pasted onto the second tape base material 36 via the adhesive material 36a, as shown in FIG. 6A (corresponding to a "fourth step"). At this time, the dummy chips 20 are fitted such that the solder pastes 15 are directed downward. Accordingly, the dummy chips 20 are pasted onto the second tape base material 36 in a state that the sacrifice layer 13 and the solder pastes 15 are opposed to the second tape base material 36.

As described above, a size of the cavity 35 is set to a dimension that enables the dummy chip 20 to be inserted into the cavity. Therefore, upon fitting the dummy chip 20 into the cavity 35, this dummy chip 20 can be easily inserted into the cavity 35. Also, a clearance shown by an arrow ΔW in FIG. 6A is formed between an outer wall of the dummy chip 20 and an inner wall of the cavity 35 in a state that the dummy chip 20 is provided into the cavity 35.

When the dummy chips 20 are provided as described above, the stiffener substrate 30 on which the second tape base material 36 is pasted and the dummy chips 20 are fitted into the molding mold, and a sealing resin 37 is molded in the circumstances in which a heat and a pressure are applied (corresponding to a "fifth step").

Figure 6B:
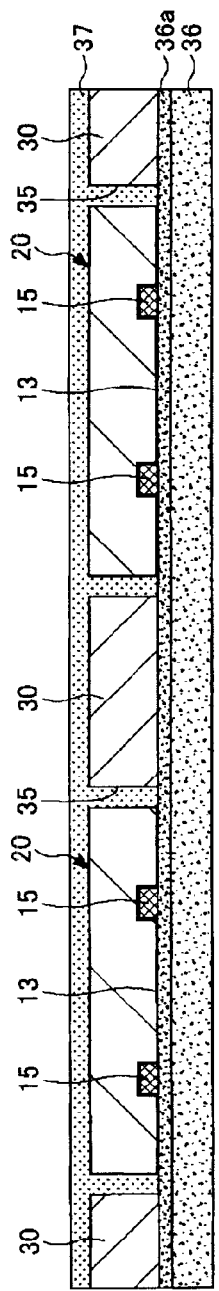

FIG. 6B shows a state that the sealing resin 37 is formed. When the sealing resin 37 is formed, the dummy chips 20 and the stiffener substrate 30 are sealed in the sealing resin 37. In this case, an epoxy resin can be employed as the sealing resin 37.

In molding this sealing resin 37, a thermal shrinkage occurs in the sealing resin 37. However, in the present embodiment, because the stiffener substrate 30 is present, the areas in which the sealing resin 37 is formed are restricted to the clearance between the dummy chips 20 and the stiffener substrate 30 and the upper surfaces of the dummy chips 20 and the stiffener substrate 30. In this manner, the areas in which the sealing resin 37 is provided are restricted, the influence of a thermal shrinkage of the sealing resin 37 becomes small. Therefore, the providing positions of the dummy chips 20 are not largely displaced.

Also, the dummy chip 20 is arranged in the cavities 35 respectively. Therefore, the dummy chip 20 is never displaced in the cavity 35 to exceed a clearance that is formed between an outer wall of the dummy chip 20 and an inner wall of the cavity 35. Thus, the prevention of displacement of the dummy chip 20 can be achieved from this respect.

Figure 6C:
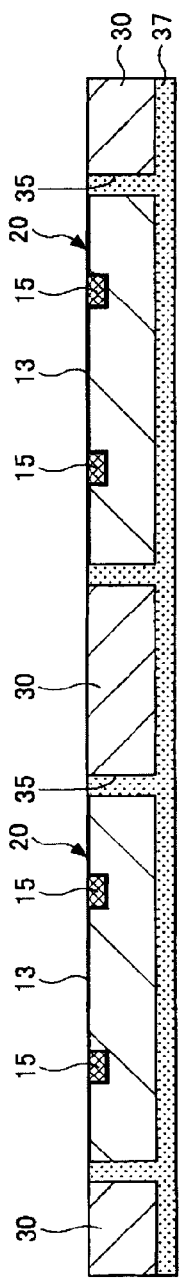

When the sealing resin 37 is formed in this manner, the adhesive material 36a is cured by applying the heating process to lower an adhesive force. Then, the second tape base material 36 is peeled from the dummy chips 20 and the stiffener substrate 30 at a point of time when an adhesive force is lowered. FIG. 6C shows a state that the second tape base material 36 is peeled.

Then, a structure in which the dummy chips 20 and the stiffener substrate 30 are integrated by the sealing resin 37 is loaded into the CVD apparatus. Then, a first insulating layer 38 is formed on all surfaces of this structure, from which the solder paste 15 is exposed respectively, by the CVD method (chemical vapor deposition method).

Figure 6D:
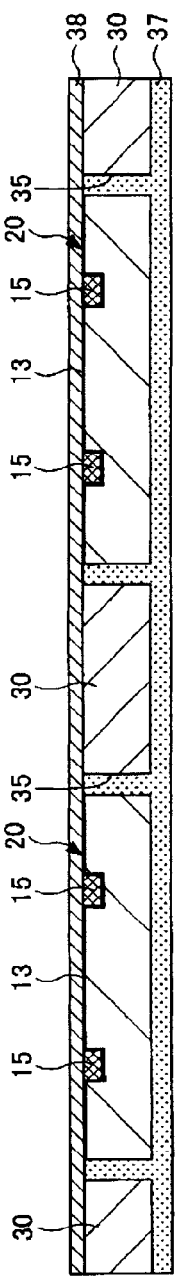

FIG. 6D shows a state that the first insulating layer 38 is formed. A thickness of this first insulating layer 38 is set to 1 μm, for example. Also, as the first insulating layer 38, for example, a silicon nitride ($Si_3N_4$) film or a silicon oxide ($SiO_2$) film can be formed.

Here, in the present embodiment, an example in which the first insulating layer 38 is formed by the CVD method to form this first insulating layer 38 thinly is illustrated. However, the CVD method used to form the first insulating layer 38 is not always restricted to the CVD method. An organic insulating resin can be employed.

Then, a resist 40 is formed on the first insulating layer 38, and also opening portions 41 are formed in the resist 40, as shown in FIG. 7A. Respective forming positions of the opening portions 41 are set to correspond to forming positions of the solder pastes 15 formed on the dummy chips 20. Also, a diameter of the opening portion 41 is set to have a diameter that is smaller than a diameter (20 μm) of the solder paste 15, for example.

In this case, a photoresist can be employed as the resist 40 used at this time, and either of the positive type and the negative type can be employed. Also, as a light source used in patterning the resist 40, the ultraviolet rays can be employed.

Then, the resist 40 is cured by the heating, and then the dry etching process is applied to the first insulating layer 38 while using this resist as a mask. As an etching gas used in this dry etching process, for example, the carbon tetrafluoride ($CF_4$) can be employed. As this etching process, either the plasma etching or the reactive ion etching (RIE) can be employed.

Thus, as shown in FIG. 7B, opening portions 42 are formed in the first insulating layer 38 by applying this dry etching process. Since a diameter of the opening portion 41 is smaller than that of the concave portion 12, a diameter of the opening portion 42 is smaller than 20 μm as the diameter of the concave portion 12 (the solder paste 15).

After the opening portions 42 are formed in the first insulating layer 38 in this manner, the resist 40 is removed by the ashing, or the like, as shown in FIG. 7C. Accordingly, the first insulating layer 38 in which the opening portions 42 are formed is exposed.

Then, as shown in FIG. 7D, a first wiring layer 45 made of Cu is formed on the first insulating layer 38 by using the well-known semi-additive process. Concretely, the catalytic process is applied to the upper surface of the first insulating layer 38 containing the inner areas of the opening portions 42, and then a seed layer is formed by applying the electroless Cu plating. In this case, this seed layer may be formed by the Ti or Cu sputter.

Then, a resist in which opening portions corresponding to the shape of the first wiring layer 45 respectively are formed is formed on the first insulating layer 38. Then, the first wiring layer 45 is formed in the opening portions by applying the electrolytic Cu plating while using the seed layer as a power feeding layer.

After the first wiring layer 45 is formed in this manner, the resist is peeled and the unnecessary seed layer is removed. Thus, the first wiring layer 45 shown in FIG. 7D is formed. In forming this first wiring layer 45, the first wiring layer 45 is connected electrically to the solder pastes 15. Here, the illustration of the catalyst, the seed layer, and the resist is omitted.

After the first wiring layer 45 is formed, an insulating layer and a wiring layer are stacked alternately on the first insulating layer 38 by using the build-up method, and also vias used to join respective layers are formed. Thus, the build-up wiring layer 48 containing the first wiring layer 45 is formed (corresponding to a "sixth step").

Concretely, a second insulating layer 39 (build-up insulating sheet) is provided on the first insulating layer 38 on which the first wiring layer 45 is formed, then via holes are formed in the forming positions of vias 47 by the laser beam machining, or the like, and then a second wiring layer 46 is formed by using again the semi-additive process that is similar to the above. At this time, Cu is deposited in the via holes, and the vias 47 are formed.

Upon forming the insulating layers 38, 39 and the wiring layers 45, 46 in the step of forming the build-up wiring layer 48, the dummy chips 20 and the stiffener substrate 30 being integrated with the sealing resin 37, act as the supporting member. Therefore, the insulating layers 38, 39 and the wiring layers 45, 46 can be formed with good precision, and the build-up wiring layer 48 can be formed with high precision.

Here, in the present embodiment, the build-up wiring layer 48 consisting of the double-layered insulating layers 38, 39 and the double-layered wiring layers 45, 46 is illustrated as an example. But the number of layers in the build-up wiring layer 48 is not restricted to this example, and can be set arbitrarily.

Figure 8A:
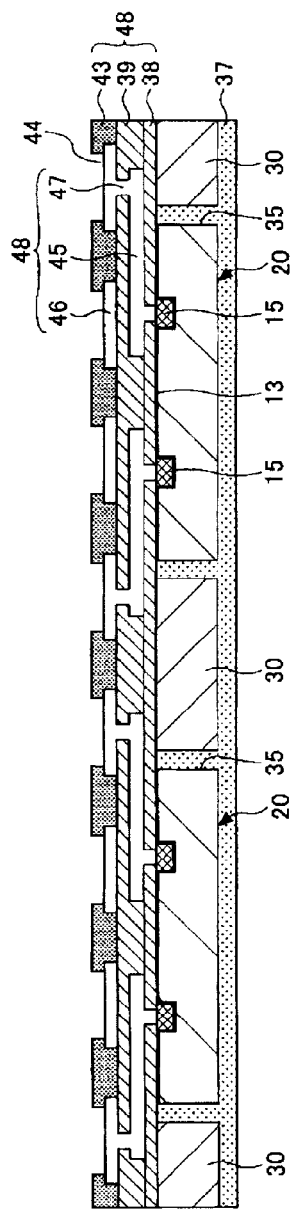
FIGS. 8A to 8C are views (#4) explaining the method of manufacturing the wiring substrate as the embodiment of the present invention.

After the build-up wiring layer 48 is formed as described above, a solder resist 43 is formed on the uppermost layer of the build-up wiring layer 48. FIG. 8A shows a state that the solder resist 43 is formed on the build-up wiring layer 48.

Figure 8B:
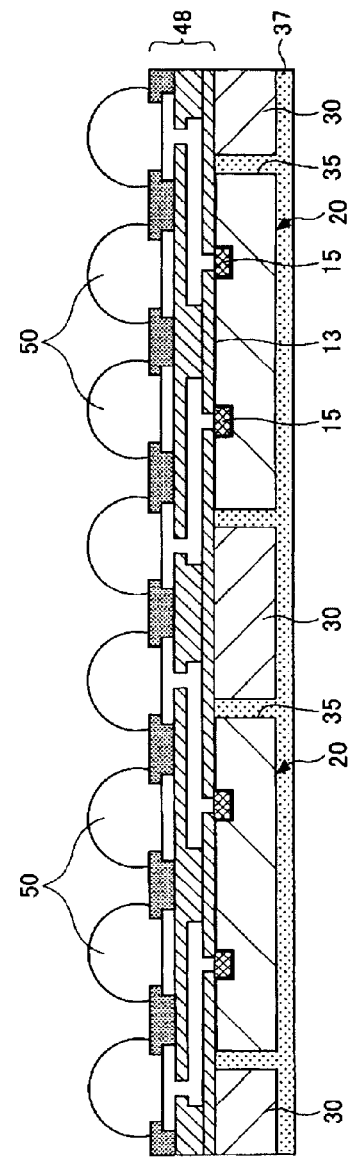

Then, a ball 50 is provided in opening portions 44, which are formed in predetermined positions of the solder resist 43, respectively. This ball 50 acts as an external connection terminal, and a solder ball, for example, can be employed. FIG. 8B shows a state that the balls 50 are provided.

Figure 8C:
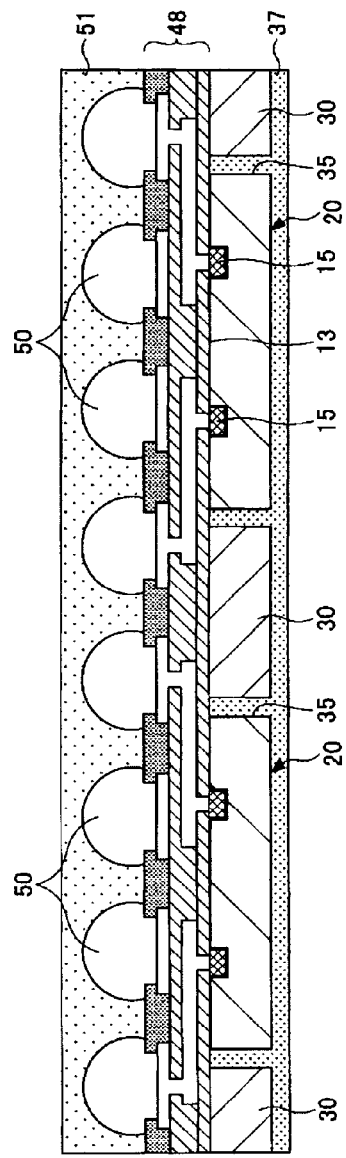

After the balls 50 are formed, a protection tape 51 is provided to cover the balls 50, as shown in FIG. 8C. As the protection tape 51, the material whose resistance against a gas used in the ashing described later is high is selected.

Then, a structure consisting of the dummy chips 20, the stiffener substrate 30, the sealing resin 37, the build-up wiring layer 48, and the like is loaded in the ashing apparatus, and then the ashing process of removing the sealing resin 37 is applied (corresponding to a "seventh step"). In the ashing process, the plasma ashing apparatus using an oxygen plasma, for example, can be employed.

FIG. 9A shows a state that the sealing resin 37 is removed by the ashing process. When the sealing resin 37 is removed, the clearance is formed again between the outer wall of the dummy chip 20 and the inner wall of the cavity 35.

After the sealing resin 37 is removed, the process of peeling the dummy chips 20 from the build-up wiring layer 48 is carried out (corresponding to an "eighth step"). In this peeling step, an etchant that is capable of etching Cu is poured into the sealing resin 37. As this etchant, for example, an iron (III) chloride aqueous solution, a copper (II) chloride aqueous solution, an ammonium peroxodisulfate aqueous solution, or the like can be employed.

As described above, the sacrifice layer 13 and the solder pastes 15 are formed on the dummy chip 20, and the build-up wiring layer 48 is formed on the surface side on which the sacrifice layer 13 and the solder pastes 15 are formed. Also, the sacrifice layer 13 is constructed by forming the Cu film on the Ti film.

Therefore, when the etchant for dissolving the Cu is supplied into the cavities 35, this etchant is fed from the outer peripheral portion of the dummy chip 20 to the boundary surface between the dummy chip 20 and the build-up wiring layer 48 to etch the Cu film constituting the sacrifice layer 13. Then, the Cu film that is interposed between the dummy chips 20 and the build-up wiring layer 48 is removed, and thus the dummy chips 20 are set in the peelable state from the build-up wiring layer 48. As a result, the Cu film acts as the peeling facilitating member when on the dummy chip 20 are peeled from the build-up wiring layer 48.

FIG. 9B shows a state that the dummy chips 20 are peeled from the build-up wiring layer 48. At this time, the first wiring layer 45 is formed directly on the solder pastes 15, and thus an adhesive force between the solder pastes 15 and the first wiring layer 45 is stronger than an adhesive force between the solder pastes 15 and the concave portions 12. Therefore, the solder pastes 15 still remain on the build-up wiring layer 48 when the dummy chips 20 are peeled.

Figure 10A:
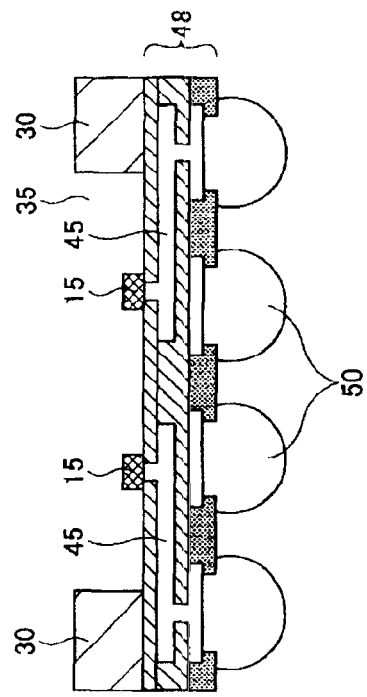
FIGS. 10A to 10C are views (#6) explaining the method of manufacturing the wiring substrate as the embodiment of the present invention.
Figure 10B:
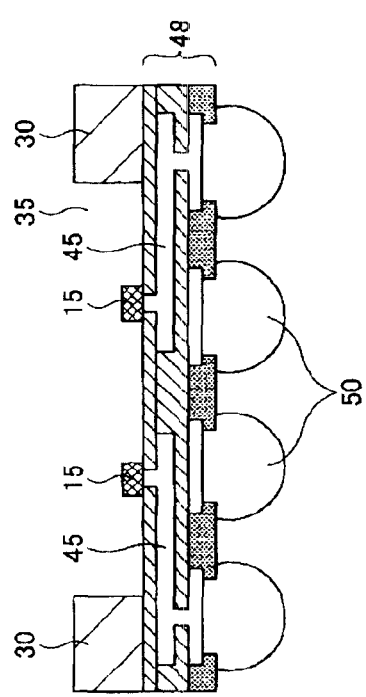
Figure 10C:
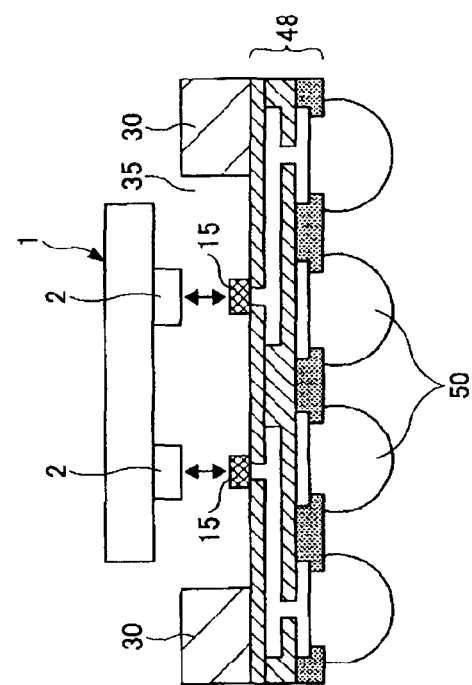

After the dummy chip 20 are peeled as described above, the stiffener substrate 30 is diced into individual pieces in unit of each wiring substrate 60, as shown in FIG. 10A. This diving process can be executed by the dicing process using the dicing saw. As shown in FIG. 10B, the wiring substrate 60 is manufactured by applying the dicing process. Also, as shown in FIG. 10B, the build-up wiring layer 48 is reinforced by the stiffener substrate 30, and also the cavity 35 formed in the stiffener substrate 30 serves as a space in which the semiconductor chip 1 is fitted.

Then, a method of manufacturing the semiconductor device using the wiring substrate 60 manufactured as described above will be explained hereunder. In the following explanation, a method of manufacturing a semiconductor device 70A (see FIG. 11) as the semiconductor device will be explained as an example.

In order to manufacture a semiconductor device 70A, first the semiconductor chip 1 is provided onto the wiring substrate 60. The semiconductor chip 1 has the pads 2, and the forming positions of the solder pastes 15 are set to correspond to the forming positions of the pads 2, as described above. Therefore, the semiconductor chip 1 is positioned such that the pads 2 are opposed to the solder pastes 15, and then the semiconductor chip 1 is fitted in the cavity 35.

At this time, in executing the above "second step" shown in FIG. 5D, the alignment mark may be formed in advance on the surfaces of the dummy chips 20 by using the resist 33.

According to this arrangement, in fitting the semiconductor chip 1 on the wiring substrate 60, the pads 2 and the solder pastes 15 can be positioned by using the alignment mark. Therefore, the semiconductor chip 1 can be fitted on the wiring substrate 60 with high precision.

After the semiconductor chip 1 is mounted on the wiring substrate 60, the pads 2 and the solder pastes 15 are joined together by applying the heating process. Accordingly, the semiconductor chip 1 is secured electrically and mechanically to the wiring substrate 60.

Then, a glass plate 62 is put on the upper surface of the stiffener substrate 30 and anodic-joined to the stiffener substrate 30. That is, a high electrostatic attractive force is produced between the stiffener substrate 30 made of silicon and the glass plate 62 by applying a high-temperature heat and a high voltage in a state that the glass plate 62 is put on the upper surface of the stiffener substrate 30, so that the stiffener substrate 30 and the glass plate 62 are joined by the chemical bonding at the boundary. After the above processes are carried out, a semiconductor device 70A is manufactured.

Figure 11:
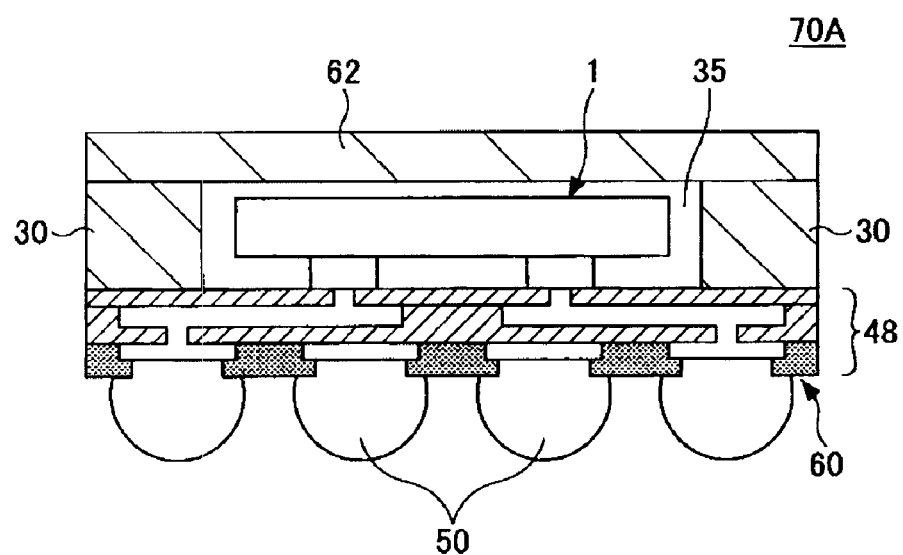
FIG. 11 is a view (#1) showing a semiconductor device using a wiring substrate manufactured by a method of manufacturing a wiring substrate as an embodiment of the present invention.
Figure 12:
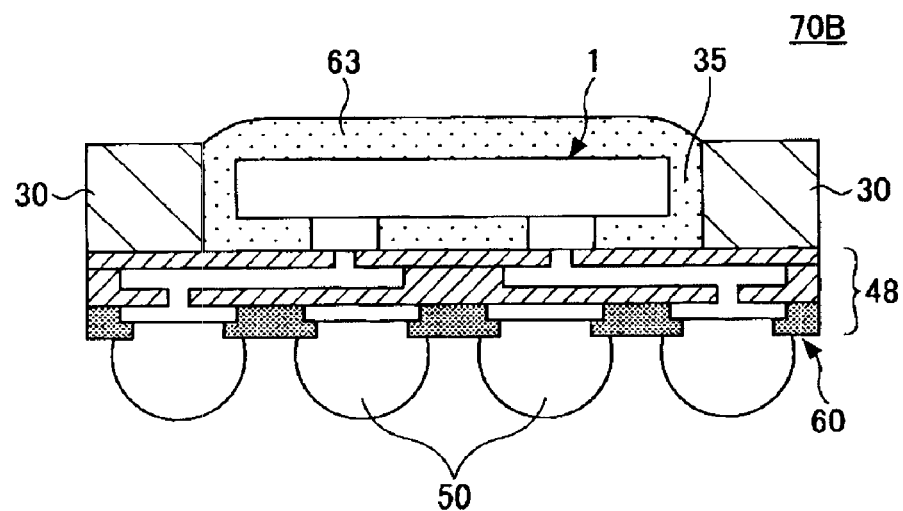
FIG. 12 is a view (#2) showing the semiconductor device using the wiring substrate manufactured by the method of manufacturing the wiring substrate as the embodiment of the present invention.

Also, in the semiconductor device 70A shown in FIG. 11, the semiconductor chip 1 is hermetically sealed in the package that is constructed by the stiffener substrate 30 and the glass plate 62. However, as shown in FIG. 12, the semiconductor chip 1 may be provided on the wiring substrate 60, and then the semiconductor chip 1 may be sealed by filling a sealing resin 63 into the cavity 35. As the method of forming the sealing resin 63, either the potting method or the molding method can be employed.

Figure 13:
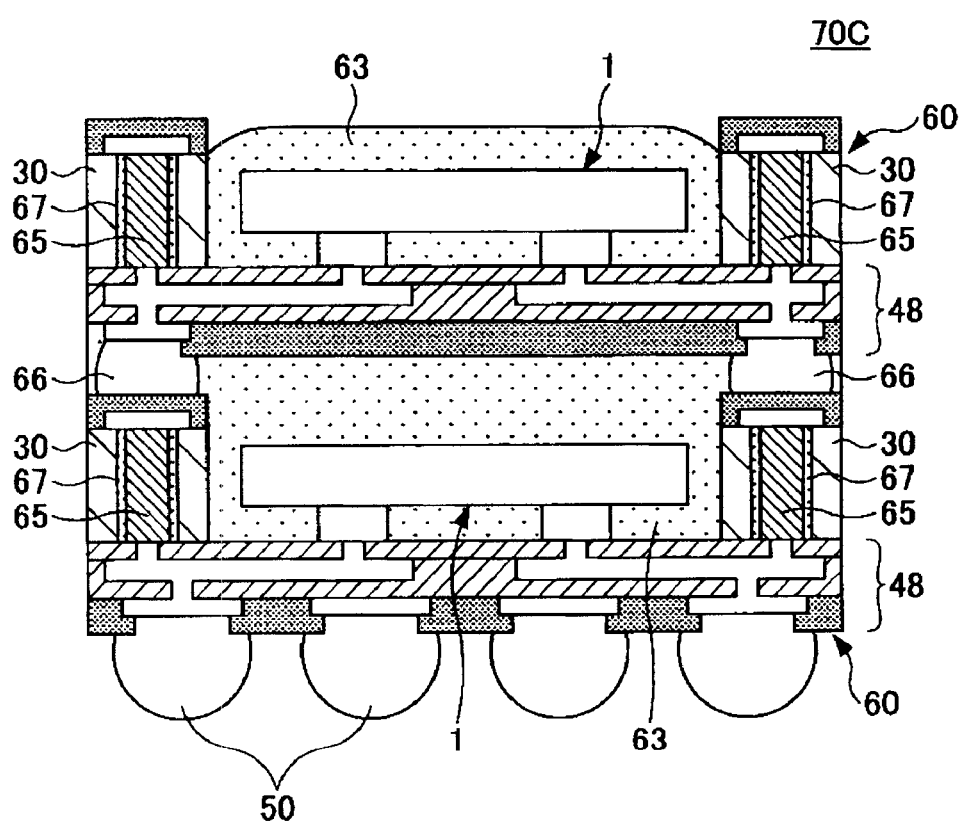
FIG. 13 is a view (#3) showing the semiconductor device using the wiring substrate manufactured by the method of manufacturing the wiring substrate as the embodiment of the present invention.

Also, as shown in FIG. 13, a semiconductor device 70C having a structure in which a plurality of wiring substrates 60 are stacked can be accomplished by forming through electrodes 65 in the stiffener substrate 30. The through electrodes 65 can be formed in such a manner that through holes in which the through electrodes 65 are filled are formed in the "second step" (see FIG. 5D) applied to form the cavity 35, and then the Cu is formed by the Cu electroplating while using the seed layer, which is used to form the first wiring layer 45, for example, as a power feeding layer.

Also, the connection between upper and lower wiring substrates 60 can be given by joining the through electrodes 65 of the lower wiring substrate 60 and the wiring layers of the build-up wiring layer 48 of the upper wiring substrate 60 via solders 66.

As described above, according to the present embodiment, the dummy chip 20 is employed in place of the semiconductor chip 1, and the steps of manufacturing the build-up wiring layer 48 are executed in a state that the dummy chip 20 is fitted into the stiffener substrate 30. Then, the semiconductor devices 70A to 70C are formed by building the semiconductor chip 1 in the wiring substrate 60 when the semiconductor device 70A is manufactured finally by using the wiring substrate 60.

Therefore, even though the defect exists in the manufactured wiring substrate 60, there is no necessity that the semiconductor should be discarded, unlike the prior art. As a result, a cost reduction of the wiring substrate 60 can be attained.

Also, the dummy chip 20 peeled from the build-up wiring layer 48 in the structure shown in FIG. 9B can be used repeatedly. At this time, the process of forming the sacrifice layer 13 and the process of providing the solder pastes 15 (the "first step") are required of the dummy chip 20.

However, the sacrifice layer 13 can be formed by the sputter method, and the solder pastes 15 can be formed by the screen printing method. Therefore, their forming processes are made easy. In this manner, since the dummy chip 20 can be used repeatedly, a manufacturing cost of the wiring substrate 60 can be further reduced.

Also, since the dummy chip 20 can be used repeatedly, a fed amount of the solder paste 15 can be set equal irrespective of the lot even when a plurality of lots are equipped in manufacturing the wiring substrate 60. Therefore, in mounting the semiconductor chip 1 shown in FIG. 10B, a variation in height of the solder (height of the bump) can be reduced.

With the above, preferred embodiments of the present invention are explained in detail. But the present invention is not restricted to the above particular embodiments, and various variations and modifications can be applied within a scope of a gist of the present invention set forth in Claims.

What is claimed is:

1. A method of manufacturing a wiring substrate, comprising:
   a first step of preparing a dummy chip and providing a peeling facilitating member on a surface of the dummy chip;
   a second step of forming an accommodating opening, in which the dummy chip is accommodated, in a reinforcing substrate;
   a third step of providing a tape member on one surface of the reinforcing substrate to cover at least the accommodating opening;
   a fourth step of inserting the dummy chip into the accommodating opening to provide the dummy chip on the tape member with the surface of the dummy chip on which the peeling facilitating member is provided in contact with the tape member;
   a fifth step of sealing the reinforcing substrate and the dummy chip with a resin;
   a sixth step of removing the tape member and forming a build-up wiring layer, in which an insulating layer and a wiring layer are stacked, on a surface from which the tape member is removed, said surface from which the tape member is removed including the surface of the dummy chip on which the peeling facilitating member is provided;
   a seventh step of removing the resin; and
   an eighth step of peeling the dummy chip from the build-up wiring layer with the peeling facilitating member facilitating peelability of the dummy chip from the build-up wiring layer.

2. A method of manufacturing a wiring substrate, according to claim 1, wherein the dummy chip is formed of silicon.

3. A method of manufacturing a wiring substrate, according to claim 1, wherein the reinforcing substrate is formed of silicon.

4. A method of manufacturing a wiring substrate, according to claim 1, wherein, in the fifth step, the resin is sealed by a molding method.

5. A method of manufacturing a wiring substrate, according to claim 1, wherein the first step includes a process of providing a solder paste within a concave portion provided on one surface side of the dummy chip, said concave portion of the dummy chip having the peeling facilitating member provided on an inner wall surface thereof, and the solder paste is provided on the peeling facilitating member.

6. A method of manufacturing a wiring substrate, according to claim 1, wherein the peeling facilitating member is formed of copper.

7. A method of manufacturing an semiconductor device, comprising:
- a step of manufacturing the wiring substrate by the method of manufacturing the wiring substrate set forth in claim 1; and
- a step of providing a chip component in the wiring substrate.

8. A method of manufacturing a wiring board, comprising:
- a first step of preparing a dummy chip and providing a peeling facilitating member on a surface of the dummy chip;
- a second step of providing a tape member on one surface of a reinforcing substrate;
- a third step of forming an accommodating opening, in which a dummy chip is accommodated, in the reinforcing substrate;
- a fourth step of inserting the dummy chip in the accommodating opening and providing the dummy chip on the tape member with the surface of the dummy chip on which the peeling facilitating member is provided in contact with the tape member;
- a fifth step of sealing the reinforcing substrate and the dummy chip with a resin;
- a sixth step of removing the tape member and forming a build-up wiring layer, in which an insulating layer and a wiring layer are stacked, on a surface from which the tape member is removed, said surface from which the tape member is removed including the surface of the dummy chip on which the peeling facilitating member is provided;
- a seventh step of removing the resin; and
- an eighth step of peeling the dummy chip from the build-up wiring layer with the peeling facilitating member facilitating peelability of the dummy chip from the build-up wiring layer.

9. A method of manufacturing a wiring substrate, according to claim 5, wherein the eighth step includes peeling the dummy chip from the build-up wiring layer while leaving the solder paste on the build-up wiring layer.

* * * * *